(12) United States Patent
Umezawa

(10) Patent No.: US 6,940,754 B2
(45) Date of Patent: Sep. 6, 2005

(54) CHANNEL ERASE TYPE NONVOLATILE SEMICONDUCTOR MEMORY DEVICE AND ELECTRONIC CARD AND ELECTRONIC APPARATUS USING THE DEVICE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 10/701,159

(22) Filed: Nov. 4, 2003

(65) Prior Publication Data

US 2004/0233715 A1 Nov. 25, 2004

(30) Foreign Application Priority Data

May 22, 2003 (JP) ........................................ 2003-144918

(51) Int. Cl.$^7$ .............................................. G11C 16/06
(52) U.S. Cl. .............................. 365/185.09; 365/185.11; 365/200
(58) Field of Search .................... 365/185.09, 185.11, 365/200, 185.23, 185.29, 185.33

(56) References Cited

U.S. PATENT DOCUMENTS 6,215,699 B1 * 4/2001 Yamamoto ............. 365/185.09

FOREIGN PATENT DOCUMENTS

JP  07-320496  12/1995

OTHER PUBLICATIONS

Toru Tanzawa et al., "A 44-mm$^2$ Four-Bank Eight-Word Page-Read 64-Mb Flash Memory With Flexible Block Redundancy and Fast Accurate Word-Line Voltage Controller", IEEE Journal of Solid-State Circuits, vol. 37, Nov. 11, 2002, pp 1485-1492.

* cited by examiner

Primary Examiner—David Lam
(74) Attorney, Agent, or Firm—Hogan & Hartson, LLP

(57) ABSTRACT

A channel erase flash memory including a redundancy word line group constituted of a plurality of redundancy word lines separately from a normal memory space of a memory cell array, and including a function of replacing the normal word line group including a defective memory cell with the redundancy word line group. In the memory, at the time of an erase operation, a first voltage is applied to a well region in which the memory cell array is formed, a second voltage of 0 V or less is applied to a normal word line, and a third voltage is applied to all the word lines included in the normal word line group including the defective memory cell or the redundancy word line group. A potential difference between the first and third voltages is set to be smaller than that between the first and second voltages.

16 Claims, 11 Drawing Sheets

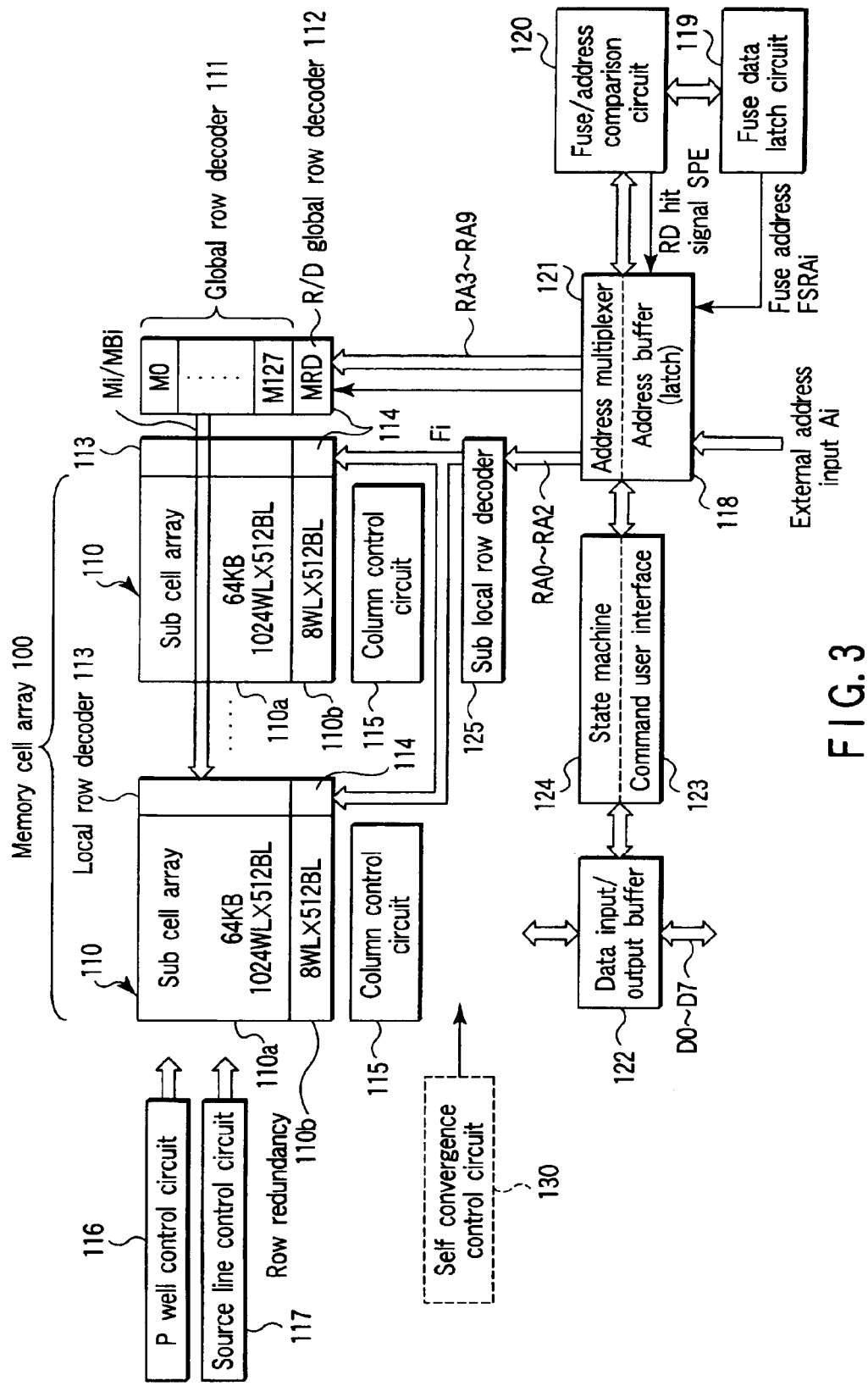
F I G. 3

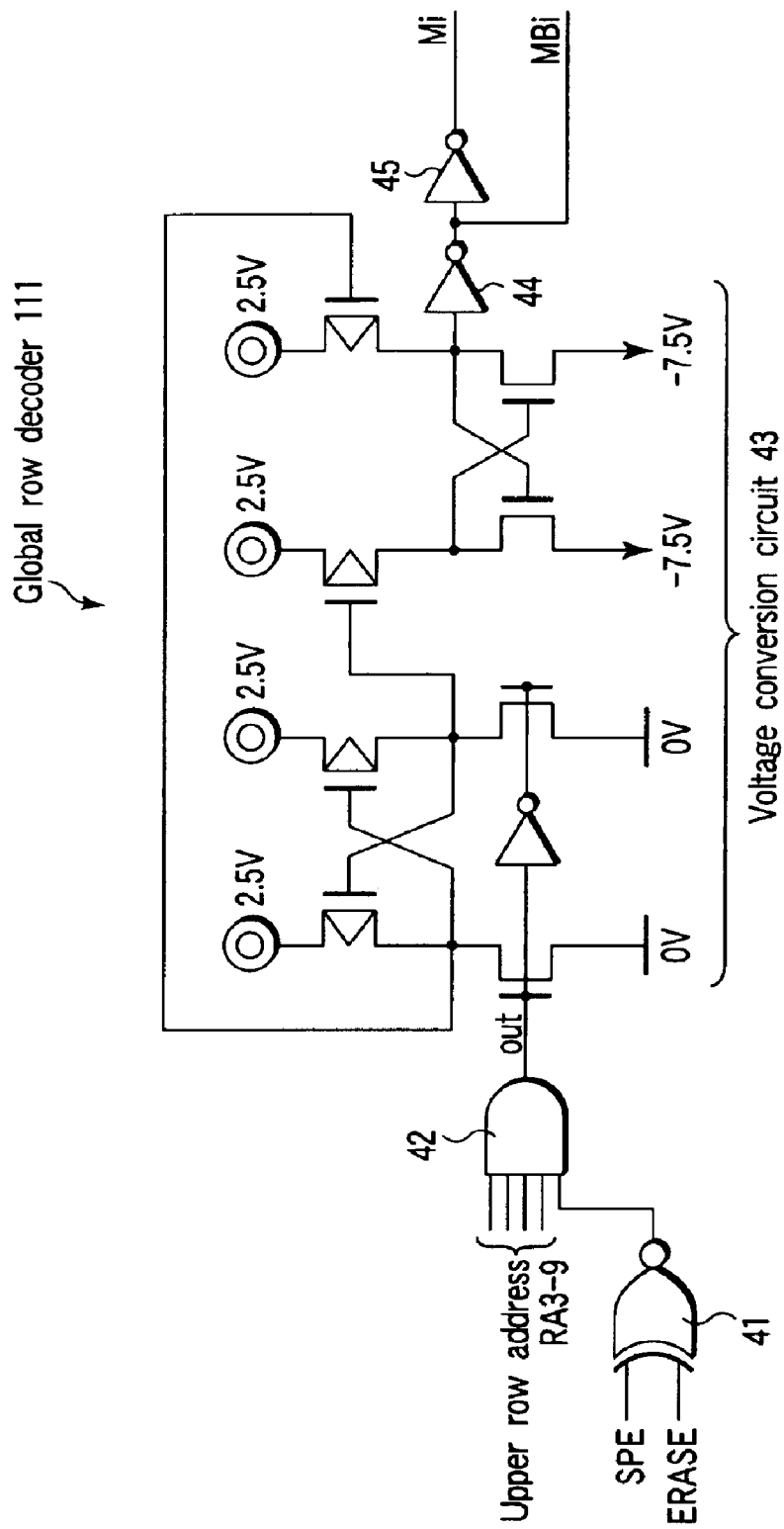
F I G. 5

CHANNEL ERASE TYPE NONVOLATILE SEMICONDUCTOR MEMORY DEVICE AND ELECTRONIC CARD AND ELECTRONIC APPARATUS USING THE DEVICE

CROSS-REFERENCE TO RELATED APPLICATIONS

This application is based upon and claims the benefit of priority from the prior Japanese Patent Application No. 2003-144918, filed May 22, 2003, the entire contents of which are incorporated herein by reference.

BACKGROUND OF THE INVENTION

1. Field of the Invention

The present invention relates to nonvolatile semiconductor memory device in which data can be electrically erased/written, such as a NOR type flash memory, and an electronic card and electronic apparatus in which the device is used, particularly to an erase control in a case where data of a large number of memory cells is collectively electrically erased.

2. Description of the Related Art

Among nonvolatile semiconductor memory device in which data can be electrically erased/written, in a block erasable flash memory, an electric charge of a floating gate of a memory cell transistor is changed by an erase/write operation to change a threshold voltage, and the data is stored. For example, when electrons of the floating gate are emitted to set the threshold voltage to a negative polarity, data "0" is stored. When the electrons are injected into the floating gate to set the threshold voltage to a positive polarity, data "1" is stored. The electrons are emitted/injected, for example, between the floating gate and a semiconductor substrate via a tunnel oxide film. Therefore, when the data is erased/written, the tunnel oxide film deteriorates, the electrons injected into the floating gate leak out of the tunnel oxide film, and it is difficult to retain the data. In the existing circumstances, a general-purpose flash memory allows 100 thousand to a million rewrites.

Additionally, in the NOR flash memory, a bias voltage having a negative polarity is applied to a gate of a memory cell, when block erasing. As the NOR flash memory, (1) a channel erasing in which the bias voltage having a positive polarity is applied to a source and a substrate or a well region and Fowler-Nordheim (FN) tunnel current is passed to erase the channel, (2) a negative gate erasing in which a bias voltage having a positive polarity is applied to the source and 0 V is applied to the substrate or well region, and the like have been known.

FIG. 1 shows one example of a sectional structure of a cell transistor in a memory cell array in the flash memory of the channel erasing.

In FIG. 1, reference numeral 11 denotes a P-type semiconductor substrate (PSUB), 11a denotes a P+-type substrate contact region, 12 denotes an N-type well region (NWELL), 13 denotes a P-type well region (PWELL), 12a denotes an N+-type well contact region, and 13a denotes a P+-type well contact region. In general, in the NOR type flash memory, a memory block to be collectively erased is 64 KBytes (=512 KBits). Therefore, the P-type well region 13 in which the memory cell is formed is divided for each memory block, and the respective P-type well regions 13 are electrically separated from each other. Moreover, a large number of memory cell transistors constituting each memory block are formed on each P-type well region 13.

FIG. 1 shows only one memory cell transistor. Reference numeral 14 denotes N+-type impurity diffusion layers formed as source and drain regions of the memory cell transistor, 15 denotes a gate insulating film which is formed on a channel region between the source and drain regions to function as a tunnel oxide film, 16 denotes a floating gate, 17 denotes a inter-gate insulating film composed, for example, of a stacked film (ONO film) of an oxide film/nitride film/oxide film, and 18 denotes a control gate. The control gate 18 is formed as a part of a word line. The drain region is connected to a bit line, and the source region is connected to a source line.

Table 1 shows one example of a voltage which has heretofore been supplied to each component of the transistor in operation modes of erase, write, read of the data in the memory cell transistor shown in FIG. 1.

TABLE 1

| Operation mode | Vg | Vd | Vs | Vpw | Vnw |
|---|---|---|---|---|---|
| Read | +5 V | +1 V | 0 V | 0 V | 0 V |
| Write | +9 V | +5 V | 0 V | 0 V | 0 V |
| Erase | −7.5 V | FL | +10 V | +10 V | +10 V |

When the data is erased, a drain potential Vd of the selected memory cell transistor is in a floating (FL) state, a control gate potential Vg is set to −7.5 V, and a source potential Vs and substrate potentials (well potentials) Vpw, Vnw are set to +10 V, respectively. At this time, the electrons injected beforehand in the floating gate 16 are pulled toward the P-type well region 13 via the tunnel oxide film 15 to erase the channel. Accordingly, the threshold voltage of the selected memory cell transistor is not more than a control gate voltage (e.g., +5 V) at the time of reading. This state is a memory state "0".

The data is collectively erased with respect to all the memory cell transistors in a selected block. At this time, the word line and bit line of a non-selected block are in the floating state, and are set to high voltages by capacitive coupling with the P-type well region 13.

At the time of data writing, the source potential Vs and substrate potentials Vpw, Vnw of the selected memory cell transistor are set to 0 V, and the control gate potential Vg is set to +9 V. In this case, to write "1", when the drain potential Vd is set to +5 V, the electrons are injected into the floating gate 16 from the channel region, and the threshold voltage of the memory cell transistor rises. Moreover, when the threshold voltage exceeds a certain value, the write is prohibited for each memory cell. On the other hand, when "0" is written, the drain potential Vd of the selected memory cell is set to 0 V, and the rise of the threshold voltage of the selected memory cell is prohibited.

At the time of data reading, the source potential Vs and substrate potentials Vpw, Vnw of the selected memory cell are set to 0 V, the drain potential Vd is set to +1 V, and the control gate potential Vg is set to a read voltage (+5 V). At this time, when the threshold voltage of the selected memory cell is not more than the read voltage (+5 V), the selected bit line and source line become conductive, and the potential of the bit line indicates a relatively low level "L". On the other hand, when the threshold voltage of the selected memory cell is not less than the read gate voltage (+5 V), the selected bit line and source line become non-conductive, and the potential of the bit line indicates a relatively high level "H".

In the channel erase flash memory, column redundancy and block redundancy are disposed as redundancy circuits for relieving various memory cell defects generated in the memory cell array. However, row redundancy is not employed for the following reasons.

That is, in a die sort test after forming a device on a wafer, when the word line in the memory cell array is found to have a short circuit with the P-type well region, a desired voltage is not applied to the word line and P-type well region. Therefore, the data is not erased in a defective block of a certain erase unit (e.g., a block constituted of 64 Kbytes) formed on the P-type well region. Therefore, the defective block has to be replaced with a redundancy block prepared beforehand in a memory chip. Since this redundancy block requires one independent memory operation, there is a penalty that a chip area increases with an increase of the number of blocks.

On the other hand, in the NOR type flash memory, there is a possibility of occurrence of a bit defect in which a drain contact of the memory cell transistor is in an open state, that is, erasable but not writable. In the NOR type flash memory, since two memory cells share one drain contact, pair bit defect easily occur. Additionally, there is also a possibility of occurrence of a single bit defect in which a defect exists simply in the channel region of one memory cell and a cell current indicates an abnormal value to cause the read defect.

There are various causes for the bit defect. When the defective bit is relieved using the block redundancy or the column redundancy, and when block relief is carried out, the defects can be completely eliminated. However, as described above, the block redundancy has a problem of penalty of the area, and is not desirable from a viewpoint of cost.

On the other hand, when the defective bit is relieved using the column redundancy, the erase voltage is applied to the defective bit at the time of erasing. Therefore, depending on the number of repeated write/erase operations, there is a risk that the defective bit shifts to an erase defect. In this manner, the column redundancy has the penalty of the area, but the penalty is not larger than that of the block redundancy, and this is advantageous from a cost aspect.

To relieve the above-described bit defect with the redundancy, to give a priority on the cost aspect, first the defect has heretofore been relieved with the column redundancy so as to minimize the block redundancy if possible. Overflow defect and the defect that can be relieved only with the block redundancy are relieved with the block redundancy.

However, when this relief is carried out, and when the write/erase operation is repeated in the memory cell, there occurs the short circuit between the word line and the well region. Even the bit defect in which the chip does not normally operate is replaced by the column redundancy. As a result, there is a risk that a market defect is caused.

It is to be noted that in Jpn. Pat. Appln. KOKAI Publication No. 7-320496 and T. Tanzawa, et al., "A 44-mm² Four-Bank Eight-Word Page-Read 64-Mb Flash Memory With Flexible Block Redundancy and Fast Accurate Word-Line Voltage Controller", IEEE JOURNAL OF SOLID-STATE CIRCUITS, VOL. 37, NO. 11, NOVEMBER 2002, in the above-described flash memory of a negative gate channel erasing, there is a redundancy. It is also disclosed that control means is disposed for preventing a negative potential bias for the erase only with respect to a defective row replaced with the spare row and the spare row not used in the replacement at the time of the erase.

As described above, in the conventional channel erase flash memory, when the bit defect is relieved with the redundancy, the write/erase operation is repeatedly performed in the memory cell, accordingly even the bit defect causing the short circuit between the word line and the well region is replaced with the column redundancy, and this has a risk of causing a market defect.

Therefore, there has heretofore been a demand for the channel erase flash memory in which the market defect involved in the bit defect causing the short circuit between the word line and the well region can be prevented from being generated.

BRIEF SUMMARY OF THE INVENTION

According to an aspect of the present invention, there is provided a nonvolatile semiconductor memory device having a write operation mode, a read operation mode, and an erase operation mode, the nonvolatile semiconductor memory comprising: a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other; a plurality of normal word lines which are disposed in the respective cell blocks and which are connected to the memory cells in the normal memory cell groups and which select the memory cells in the normal memory cell group; a plurality of redundancy word lines which are disposed in the respective cell blocks and which are connected to the memory cells in the redundancy memory cell group and which are replaced with the normal word lines and used and which select the memory cells in the redundancy memory cell group; a plurality of bit lines which are disposed in the respective cell blocks and which are connected to the memory cells in the normal memory cell group and the memory cells in the redundancy memory cell group; a well control circuit which is connected to the plurality of semiconductor regions and which applies a first voltage having a positive polarity to the semiconductor region corresponding to at least one cell block among the plurality of cell blocks at the time of the erase operation mode; and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced.

BRIEF DESCRIPTION OF THE SEVERAL VIEWS OF THE DRAWING

FIG. 3 is a block diagram showing a circuit constitution example of the flash memory in the device of FIG. 2;

FIG. 5 is a circuit diagram showing a part of a global row decoder in FIG. 3;

DETAILED DESCRIPTION OF THE INVENTION

An embodiment of the present invention will hereinafter be described in more detail with reference to the drawings.

Figure 2:
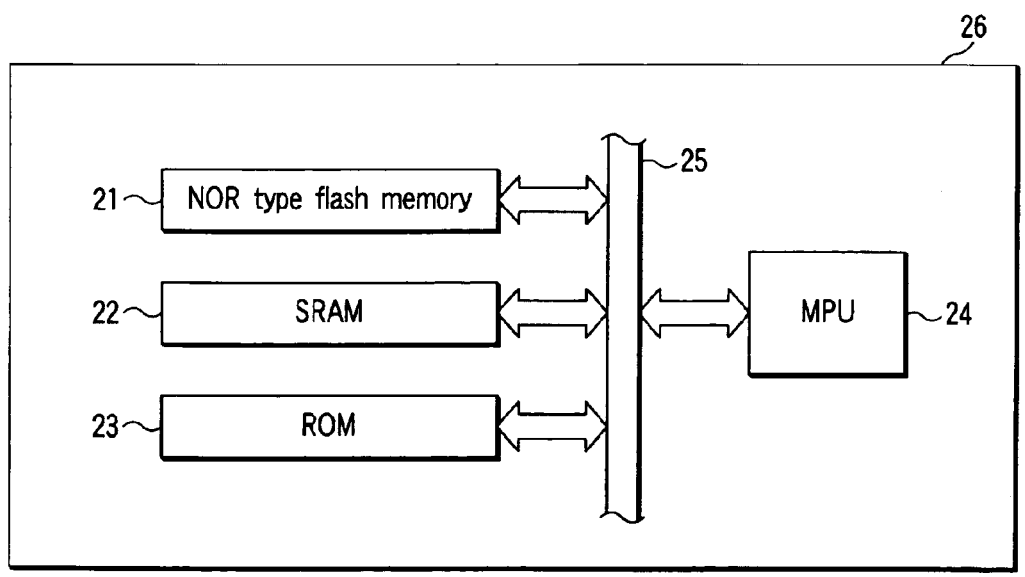
FIG. 2 is a block diagram of a semiconductor integrated circuit device according to a first embodiment of the present invention.

FIG. 2 is a block diagram showing a whole constitution of a semiconductor integrated circuit device according to a first embodiment of the present invention. As shown in FIG. 2, in the semiconductor integrated circuit device, a NOR type flash memory 21, SRAM 22, ROM 23, MPU 24, and system I/O bus line 25 are integrated in one semiconductor chip 26. The NOR type flash memory 21, SRAM 22, ROM 23, and MPU 24 are mutually connected via the system I/O bus line 25. The MPU 24 which is a system controller accesses the ROM 23 to read a system start program at the time of system start.

FIG. 3 is a block diagram showing one example of a circuit constitution of the NOR type flash memory 21 in FIG. 2. In a memory cell array 100, pluralities of memory cells are disposed. The plurality of memory cells in the memory cell array 100 are divided, for example, by the unit of 64 KB for each cell block 110. The respective cell blocks 110 are separated from each other, and include a plurality of electrically separated substrates such as well regions, and a plurality of memory cells are formed in each well region.

A first row decoder circuit is disposed on one end of the memory cell array 100. The first row decoder circuit is disposed in common with a plurality of cell blocks 110. The first row decoder circuit includes a global row decoder 111 and a redundancy (R/D) global row decoder 112. The global row decoders (M0 to M127) 111 and R/D global row decoder (MRD) 112 decode upper row addresses RA3 to RA9 supplied from an address multiplexer 121.

The plurality of memory cells are arranged in a matrix manner in each cell block 110, some of the memory cells form a normal memory cell group 110a including a normal memory space, and the remaining memory cells form a redundancy memory cell group 110b including a redundancy memory space. In the normal memory cell group 110a, 1024 word lines (WL) and 512 bit lines (BL) are arranged. In the redundancy memory cell group 110b, 512 bit lines (BL) connected to the bit lines (BL) in the normal memory cell group 110a and eight word lines (WL) are arranged. The 1024 word lines (WL) in the normal memory cell group 110a and eight word lines (WL) in the redundancy memory cell group 110b have a double word line structure.

A second row decoder circuit is disposed in common with the plurality of cell blocks 110. The second row decoder circuit includes a sub local row decoder 125. The sub local row decoder 125 decodes lower row addresses RA0 to RA2 supplied from the address multiplexer 121, and outputs a word line driving potential having a desired potential in response to selection/non-selection of each cell block 110.

Moreover, on one end of the plurality of cell blocks 110, a plurality of third row decoder circuits are arranged for the respective sub-cell blocks 110. Each third row decoder circuit includes a local row decoder 113 and a redundancy (R/D) local row decoder 114.

Each local row decoder 113 individually selects/controls the word lines of the normal memory cell group 110a in the corresponding cell block 110 based on output signals of the global row decoder 111 and sub local row decoder 125, and outputs a necessary voltage for erase, write, and read with respect to the selected word line.

The R/D local row decoder 114 individually selects/controls the word lines of the redundancy memory cell group 10b in the cell block 110 based on the output signals of the R/D global row decoder 112 and sub local row decoder 125, and outputs a necessary voltage for erase, write, and read with respect to the selected word line.

At the time of the erase operation in the selected cell block, a voltage applied to the normal word line corresponding to the normal memory cell or applied to the replaced/used redundancy word line by the local row decoder 113 and R/D local row decoder 114 is different from that applied to the normal word line corresponding to a defective memory cell or applied to the non-replaced/non-used redundancy word line.

A plurality of column control circuits 115 are arranged for the plurality of cell blocks 110. Each column control circuit 115 includes a column selection circuit for selecting the bit line in the corresponding cell block, a column decoder circuit for electrically activating the column selection circuit, a sense amplifier, a bit line potential control circuit, and the like. A plurality of column control circuits 115 has a function of controlling the voltage of the bit line in accordance with stored write data to control the write at the time of the write with respect to the selected cell, and sensing the voltage of the bit line to store the data at the time of the read from the selected cell.

Moreover, with respect to all the cell blocks 110, a P well control circuit 116 and source line control circuit 117 are arranged in common. The P well control circuit 116 selects the cell block 110, and outputs a predetermined voltage to the substrate of the selected cell block 110 such as the well region in accordance with various operation modes. The source line control circuit 117 controls the source line potential of each cell block 110.

Furthermore, an address buffer circuit 118 in which an external address signal is input, and a fuse data latch circuit 119 in which a fuse device is used to store data of a row defect address corresponding to a defective memory cell if any are disposed. Additionally, a fuse/address comparator circuit 120 is disposed to compare the data of the address buffer circuit 118 with the data (fuse address FSRAi) of the fuse data latch circuit 119 to output a comparison signal (RD hit signal SPE) indicating agreement/disagreement, and the address multiplexer 121 is also disposed.

The address multiplexer 121 outputs the data of the fuse data latch circuit 119 as an internal address signal, when the comparison signal of the fuse/address comparator circuit 120 indicates agreement at the time of the erase operation mode, and outputs the data of the address buffer circuit 118 as the internal address signal, when the comparison signal indicates disagreement. Furthermore, the address multiplexer 121 supplies the upper row addresses RA3 to RA9 together with the control signal to the global row decoder 111 and the redundancy (R/D) global row decoder 112, and supplies the lower row addresses RA0 to RA2 to the sub local row decoder 125.

A data input/output buffer 122 is connected to external input/output (IO) lines D0 to D7. The data input/output buffer 122 receives the write data from the outside, outputs read data to the outside, and receives command data, and the like from the outside. Concretely, the write data received from the outside is sent to the column control circuit 115, and the data read from the column control circuit 115 is received to output the data to the outside. The command data received from the outside is sent to a command user interface 123.

The command user interface 123 receives the control signal from the outside to judge whether the data input in the data input/output buffer 122 is the write data or command data, and sends the data as a reception command signal to a state machine 124, when the data is the command data.

The state machine 124 manages the whole flash memory, receives the command from the outside to carry out the operations such as read, write, and erase, and manages input/output of the data.

Figure 4:
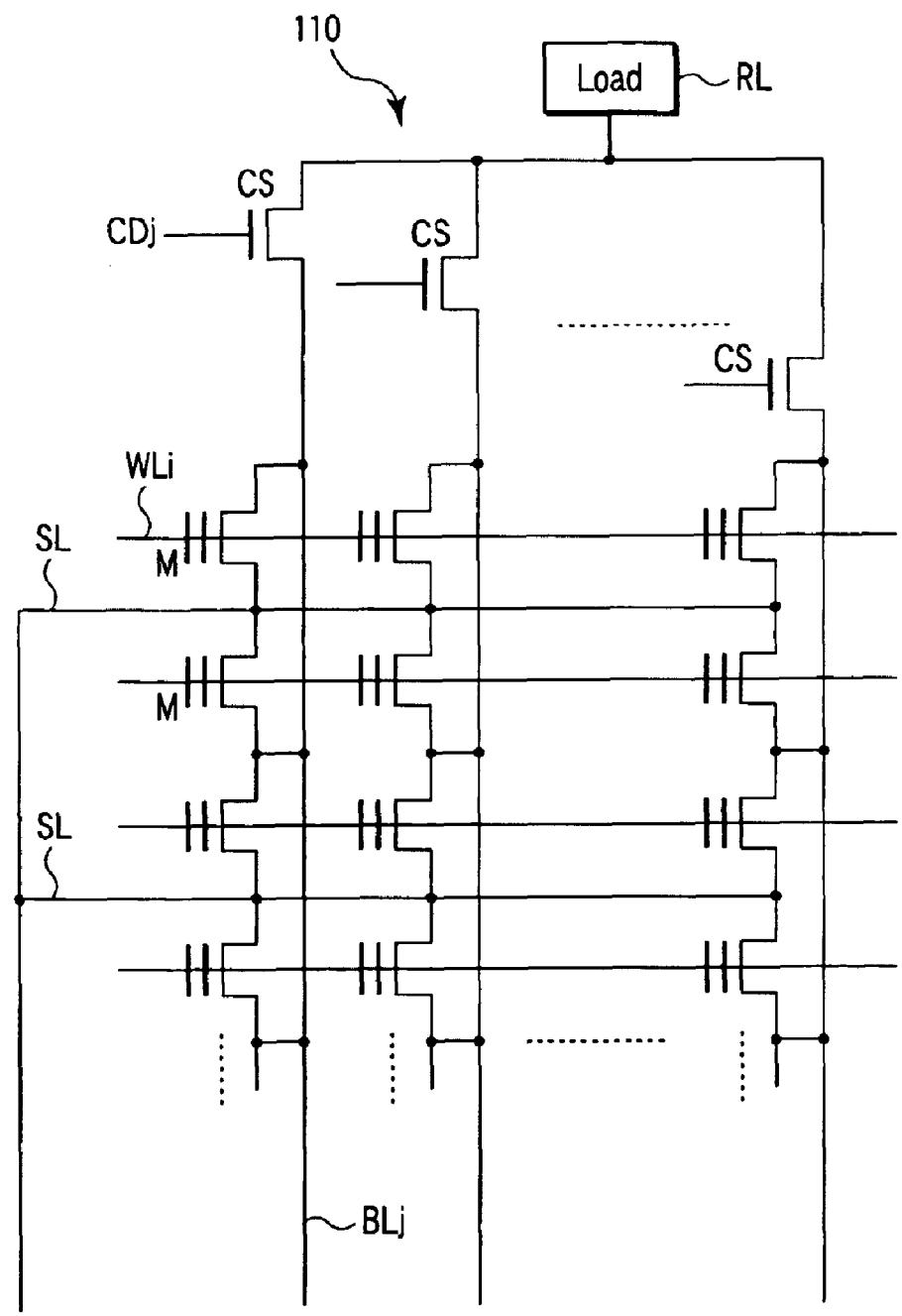
FIG. 4 is a circuit diagram showing one example of the constitution of one sub-cell array representatively taken out of a plurality of sub-cell arrays of the flash memory of FIG. 3.

FIG. 4 is a circuit diagram showing a constitution example of one sub-cell array representatively taken out of a plurality of sub-cell arrays 110 in FIG. 3.

The sub-cell array 110 is formed in each P-type well region 13 divided by each minimum unit of erase in the memory cell array. In the normal memory space 110a in the sub-cell array 110, 512K (1024×512=512 Kbits=64 Kbytes) cell transistors M are arranged in the matrix manner.

The respective drains of the plurality of cell transistors M arranged in the same row are connected to the corresponding different bit lines BLj (j=0 to 511). Moreover, the respective drains of the plurality of cell transistors M arranged in the same column are connected to the same bit line BLj. The respective sources of a plurality of cell transistors M for two rows disposed adjacent to each other in a column direction are connected in common to the same source line SL.

A plurality of rows of word lines WLi (i=0 to 1023) are connected in common to the respective gates of a plurality of memory cells M of the corresponding same row. That is, the data is simultaneously written and read with respect to 512 memory cells M connected in common to one word line WLi.

One end of a plurality of column selection switches CS each formed of NMOSFET is connected to one end of a plurality of bit lines BLj. The other end of a certain number of column selection switches CS is connected to a common load circuit RL. The plurality of column selection switches CS is selected, when a column decode signal CDj output from a column decoder circuit in a column control circuit is given to the gate.

Since a sectional structure of each memory cell M in the sub-cell array 110 shown in FIG. 4 is the same as that described with reference to FIG. 1, the description is omitted.

Figure 1:
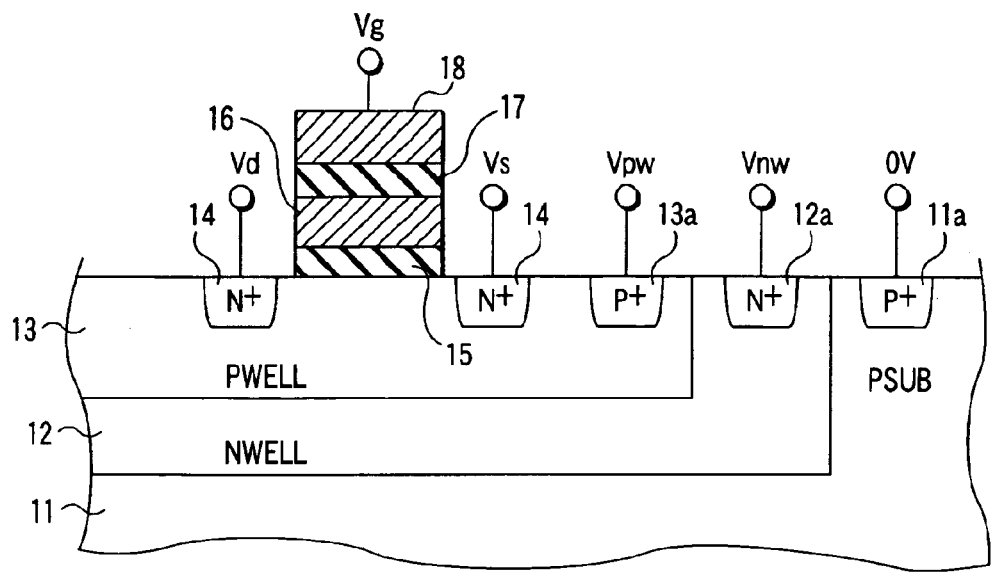
FIG. 1 is a sectional view showing one example of a structure of a memory cell of a channel erase flash memory.

In the sub-cell array including the memory cell structured as shown in FIG. 1, when the voltage is applied as heretofore applied at the time of the operation, a certain degree of voltage stress is applied to the defective cell as described above. After the write/erase is repeated, there is fear that a short circuit occurs between the word line and the substrate eventually.

To solve the problem, in the present example, to set the voltage stress to zero with respect to the defective cell at the time of erasing, withstand voltage of a MOS transistor constituting the row decoder circuits such as the global row decoder 111, R/D global row decoder 112, local row decoder 113, R/D local row decoder 114, and sub local row decoder 125 is raised to 10 V or more, and the word line voltage of the defective bit is raised than before.

Additionally, when the withstand voltage of the row decoder circuit is excessively large, there occurs a necessity of increasing an oxide film thickness or a gate length of the MOS transistor constituting the row decoder circuit. Since this influences a data reading speed, attentions are required.

FIG. 5 shows a concrete constitution of one of 128 row decoder circuits disposed in the global row decoder 111 in FIG. 3.

In FIG. 5, RD hit signal SPE output from the fuse/address comparator circuit 120 in FIG. 3 and erase mode signal ERASE output from the state machine 124 in FIG. 3 are input into an exclusive NOR gate 41. The output signal of the exclusive NOR gate 41 and the upper row addresses RA3 to RA9 output from the address multiplexer 121 in FIG. 3 are input into an AND gate 42. An output signal out of the AND gate 42 is input into a voltage conversion circuit 43, and a level is converted such that the signal has a level "H" of +2.5 V and a level "L" of −7.5 V. The level-converted signal is successively reversed by two stages of inverter circuits 44, 45, and waveforms are shaped to obtain a complementary signal Mi/MBi (i=0 to 127). It is to be noted that +2.5 V and −7.5 V are supplied as power supply voltages to the inverter circuits 44, 45.

Next, the operation of the circuit of FIG. 5 will be described with reference to a true value table in Table 2.

TABLE 2

| Conditions | SPE | ERASE | out |
|---|---|---|---|
| R/D is not hit, and not erase mode (write, and the like) | "L" | "L" | Decode output |
| R/D is hit, and not erase mode (write, and the like) | "H" | "L" | "L" |
| R/D is not hit, and erase mode | "L" | "H" | "L" |
| R/D is hit, and erase mode | "H" | "H" | Decode output |

When a comparison result of the data in the fuse/address comparator circuit 120 in FIG. 3 indicates disagreement, that is, when R/D is not hit, and it is a mode other than the erase mode such as the write, SPE="L", ERASE="L". The output signal out of the AND gate 42 selectively indicates "H", because row address signals RA3 to RA9 are decoded.

When the comparison result of the data in the fuse/address comparator circuit 120 indicates agreement, that is, when R/D is hit, and it is the mode other than the erase mode such as the write, SPE="H", ERASE="L". The output signal out of the AND gate 42 indicates "L".

When R/D is not hit, and at the time of the erase mode, SPE="L", ERASE="H". The output signal out of the AND gate 42 indicates "L".

When R/D is hit, and at the time of the erase mode, SPE="H", ERASE="H". The output signal out of the AND gate 42 decodes the row address signals RA3 to RA9 and selectively indicates "H".

Figure 6:
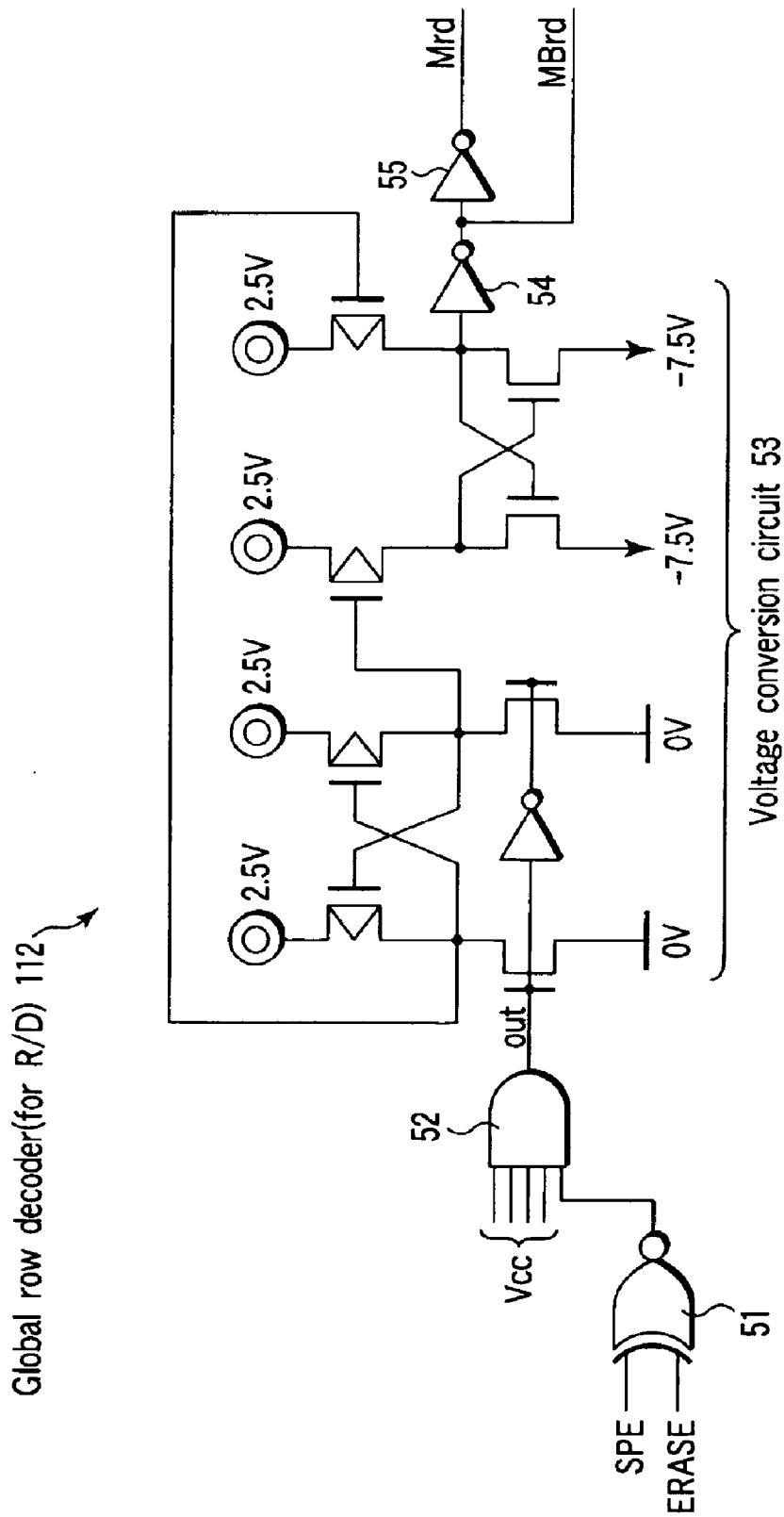
FIG. 6 is a circuit diagram showing the global row decoder for redundancy in FIG. 3.

FIG. 6 shows a concrete circuit constitution of the global row decoder for redundancy 112 in FIG. 3.

In FIG. 6, the RD hit signal SPE output from the fuse/address comparator circuit 120 in FIG. 3 and the erase mode signal ERASE supplied from the state machine 124 in FIG. 3 are input into an exclusive NOR gate 51. The output signal of the exclusive NOR gate 51 and the number of Vcc potentials corresponding to the number of upper row address signals RA3 to RA9 are input in an AND gate 52. The output signal out of the AND gate 52 is input into a voltage conversion circuit 53, and the level is converted such that the signal has a level "H" of +2.5 V and a level "L" of −7.5 V. The level-converted signal is successively reversed by two stages of inverter circuits 54, 55, and the waveform is shaped to that of the complementary signal Mrd/MBrd. It is to be noted that +2.5 V and −7.5 V are supplied as the power supply voltages to the inverter circuits 54, 55.

Next, the operation of the circuit of FIG. 6 will be described with reference to the true value table in Table 3.

TABLE 3

| Conditions | SPE | ERASE | out |
|---|---|---|---|
| R/D is not hit, and not erase mode (write, and the like) | "L" | "L" | "L" |
| R/D is hit, and not erase mode (write, and the like) | "H" | "L" | "H" |
| R/D is not hit, and erase mode | "L" | "H" | "H" |
| R/D is hit, and erase mode | "H" | "H" | "L" |

When the comparison result of the data in the fuse/address comparison circuit 120 in FIG. 3 indicates the disagreement, that is, when R/D is not hit, and it is the mode other than the erase mode such as the write, SPE="L", ERASE="L". The output signal out of the AND gate 52 indicates "L".

When the comparison result of the data in the fuse/address comparator circuit 120 indicates the agreement, that is, when R/D is hit, and it is the mode other than the erase mode such as the write, SPE="H", ERASE="L". The output signal out of the AND gate 52 indicates "H".

When R/D is not hit, and at the time of the erase mode, SPE="L", ERASE="H". The output signal out of the AND gate 52 indicates "H".

When R/D is hit, and at the time of the erase mode, SPE="H", ERASE="H". The output signal out of the AND gate 52 indicates "L".

Figure 7:
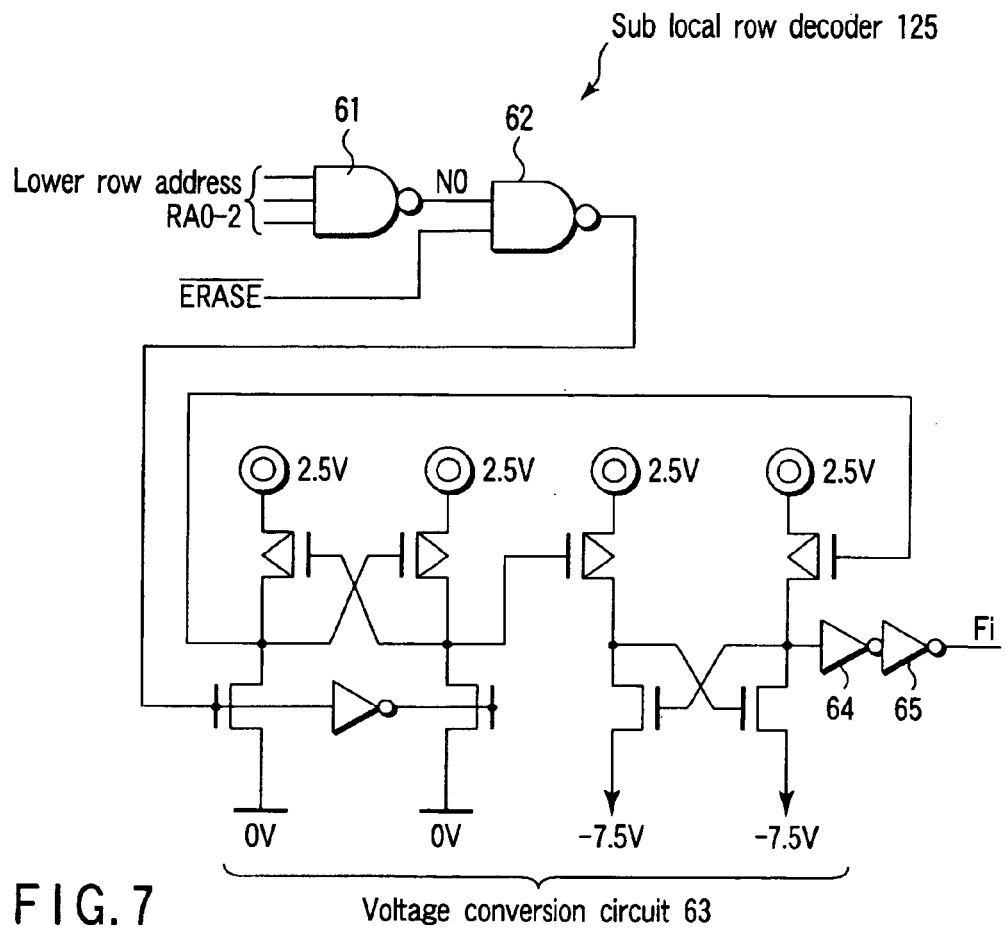
FIG. 7 is a circuit diagram showing a part of a sub-local row decoder in FIG. 3.

FIG. 7 shows a concrete circuit constitution for one of eight circuits for a plurality of sub-cell arrays 110 in the sub local row decoder 125 in FIG. 3.

In FIG. 7, the lower row address signals RA0 to RA2 output from the address multiplexer 121 in FIG. 3 are input into a NAND gate 61. An output signal NO of the NAND gate 61 and a reverse erase mode signal /ERASE output from the state machine 124 in FIG. 3 are input in a NAND gate 62. The output signal of the NAND gate 62 is input into a voltage conversion circuit 63, and the level is converted such that the signal has the level "H" of +2.5 V and level "L" of −7.5 V. The level-converted signal is successively reversed by two stages of inverter circuits 64, 65, and a signal Fi (any one of i=0 to 7) corresponding to each sub-cell array 110 is output. It is to be noted that +2.5 V and −7.5 V are supplied as the power supply voltages to the inverter circuits 64, 65.

Next, the operation of the circuit of FIG. 7 will be described with reference to the true value table in Table 4.

TABLE 4

| ERASE | NO | Fi |
|---|---|---|
| "L" | "L" | "H" |
| "L" | "H" | "L" |
| "H" | * | "H" |

The lower address signals RA0 to RA2 are decoded in the NAND gate 61, and the output signal NO indicates "L" or "H". When it is the mode other than the erase mode such as the write, ERASE="L", /ERASE="H", and the output signal of the NAND gate 62 indicates "H" or "L". Accordingly, the output signal Fi of the sub local row decoder 125 indicates "H" or "L".

At the time of the erase mode, ERASE="H", /ERASE= "L", and the output signal of the NAND gate 62 indicates "H", and the output signal Fi of the sub local row decoder 125 indicates "H". It is to be noted that in the true value table in Table 4, symbol * of the output signal NO of the NAND gate 61 indicates don't care.

Figure 8:
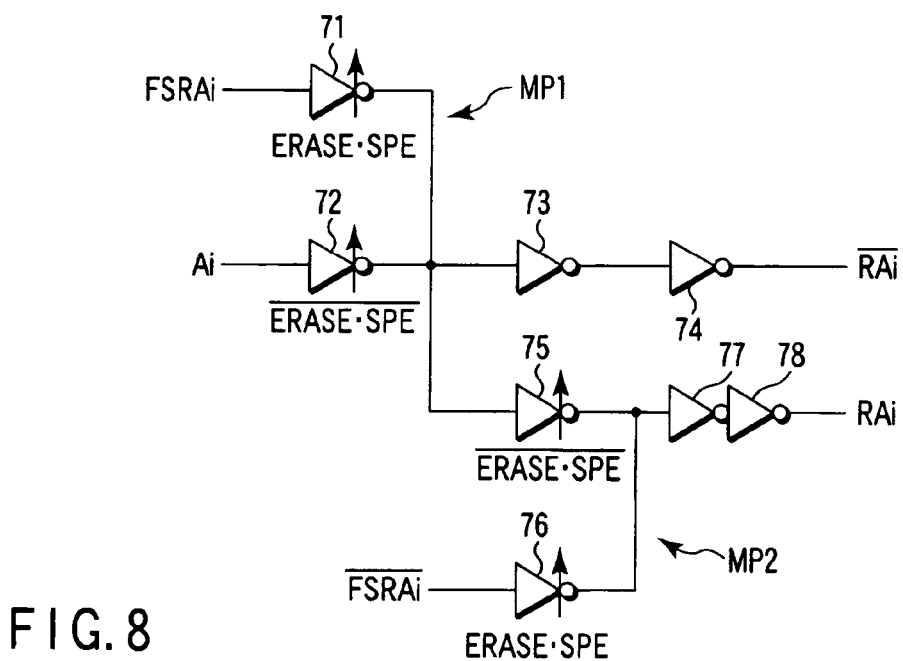
FIG. 8 is a circuit diagram showing an address multiplexer circuit in FIG. 3.

FIG. 8 shows a concrete circuit constitution of a part of the address buffer circuit 118 and address multiplexer 121 in FIG. 3. In FIG. 8, a fuse address signal FSRAi output from the fuse data latch circuit 119 in FIG. 3 is input into a clocked inverter circuit 71. An address signal Ai input from the outside is input into a clocked inverter circuit 72. Output nodes of two clocked inverter circuits 71, 72 are wired OR connected.

The clocked inverter circuit 71 is activated/controlled by a signal ERASE●SPE obtained by obtaining a logical product of the erase mode signal ERASE and the output signal SPE of the fuse/address comparison circuit 120 in FIG. 3. The clocked inverter circuit 72 is activated/controlled by a reverse signal /ERASE●SPE of the signal ERASE●SPE.

That is, the clocked inverter circuits 71, 72 are activated/controlled in a complementary manner, and constitute an address buffer/multiplexer MP1 for a switch so as to select and output the reverse signal of the signal FSRAi, when the comparison result of the fuse/address comparator circuit 120 indicates the agreement at the time of the erase operation and so as to output the reverse signal of the signal Ai, when the disagreement is indicated. The output signal of the address buffer/multiplexer MP1 is successively reversed by two stages of inverter circuits 73, 74, and an internal address reverse signal /RAi is output.

The output signal of the address multiplexer MP1 is further input into a clocked inverter circuit 75. A reverse signal /FSRAi of the fuse address signal FSRAi output from the fuse data latch circuit 119 in FIG. 3 is input into a clocked inverter circuit 76. The respective output nodes of two clocked inverter circuits 75, 76 are wired OR connected. The clocked inverter circuit 75 is activated/controlled by the signal /ERASE●SPE, and the clocked inverter circuit 76 is activated/controlled by the signal ERASE●SPE.

That is, the clocked inverter circuits 75 and 76 are activated/controlled in the complementary manner, and constitute an address buffer/multiplexer MP2 for the switching so as to output the signal FSRAi, when the comparison result of the fuse/address comparison circuit 120 indicates the agreement at the time of the erase operation and so as to output the signal Ai, when the disagreement is indicated. The output signal of the address buffer/multiplexer MP2 is successively reversed by two stages of inverter circuits 77, 78, and an internal address signal RAi is output.

In the NOR type flash memory of the present example, the word lines are selected by the unit of eight lines based on the upper row address signals RA3 to RA9, and any one is selected from the word lines by the unit of eight lines based on the lower row address signals RA0 to RA2. Therefore, when the upper row address is stored beforehand as the defective address, row redundancy can be realized, so that the defective bit is relieved by the unit of eight lines.

Figure 9:
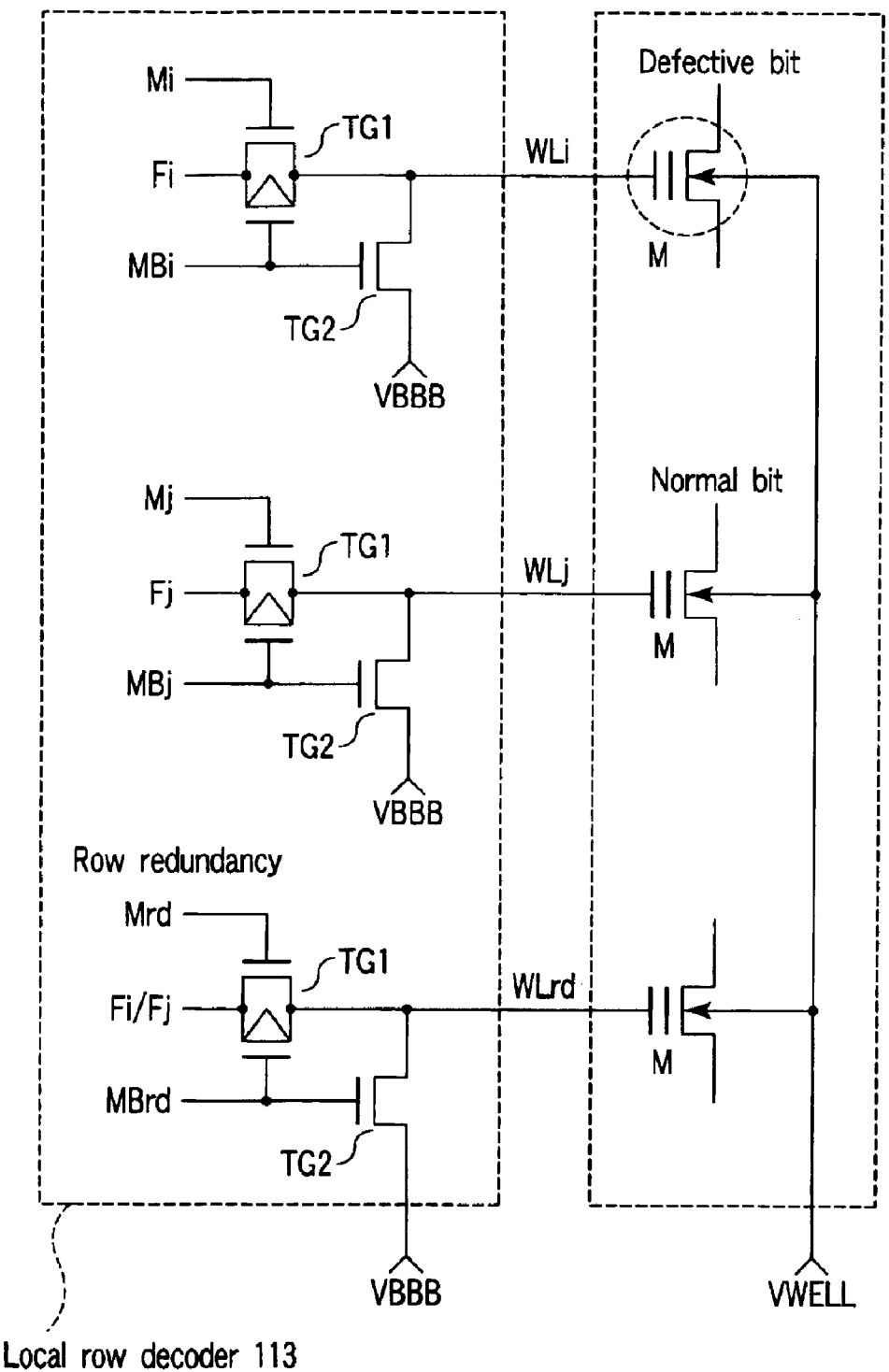
FIG. 9 is a circuit diagram showing a part extracted from the circuit in a case where a defective bit exists in the sub-cell array of the flash memory of FIG. 3.

In FIG. 9, in a case where the defective bit is generated in one of the sub-cell arrays 110 of the NOR type flash memory shown in FIG. 3 and the redundancy memory cell group 110b is used to replace the defect, a circuit connection relation is shown between the output circuits of some of the local row decoders 113 and some of the memory cells M.

In FIG. 9, Mi and MBi, Mj and MBj, . . . are complementary signals output from the global row decoder 111 in FIG. 3, and Mrd and MBrd are complementary signals output from the R/D global row decoder 112 in FIG. 3. Fi, Fj are signals obtained by selecting signals Fi output from the sub local row decoder 125 in FIG. 3 by the unit of eight signals by the local row decoder 114. Fi/Fj is a signal obtained by selecting the signals Fi output from the sub local row decoder 125 in FIG. 3 by the unit of eight signals by the local row decoder 114 for redundancy. Moreover, VBBB is an erase voltage of −7.5 V applied at the time of the collective erase of the data.

A plurality of CMOS transfer gates TG1 are inserted in series with respect to the plurality of word lines WLi, WLj, . . . WLrd. The plurality of CMOS transfer gates TG1 are switched/controlled by the signals Mi and MBi, Mj and MBj, Mrd and MBrd, and the signal Fi, Fj or Fi/Fj is output to the corresponding gate of the memory cell M at the time of read/write.

A plurality of NMOS transfer gates TG2 is connected between the plurality of word lines WLi, WLj, . . . WLrd and the node of VBBB. The plurality of NMOS transfer gates TG2 are switched/controlled by the signals MBi, MBj, . . . MBrd, and the erase voltage VBBB is output to the gate of the memory cell M at the time of the collective erase of the data.

Next, the operation of the circuit of FIG. 9 at the time of data erase will be described with reference to Tables 5 to 7.

TABLE 5

| Mi | MBi | Fi | VBBB | WLi | VWELL |
|---|---|---|---|---|---|
| 2.5 V | −7.5 V | 2.5 V | −7.5 V | 2.5 V | 10 V |

TABLE 6

| Mj | MBj | Fj | VBBB | WLj | VWELL |
|---|---|---|---|---|---|
| −7.5 V | 2.5 V | 2.5 V | −7.5 V | −7.5 V | 10 V |

TABLE 7

| Mrd | MBrd | Fi/Fj | VBBB | WLrd | VWELL |
|---|---|---|---|---|---|
| −7.5 V | 2.5 V | 2.5 V | −7.5 V | −7.5 V | 10 V |

A drain potential Vd of the selected memory cell M, that is, the potential of the bit line connected to the selected memory cell M is in a floating state (FL), and a source potential Vs and potential VWELL of a well region are both set to +10 V.

At this time, as shown in Table 5, the voltage level of an output signal Mi of the global row decoder 111 corresponding to the word lines WLi by the unit of eight lines including the defective bit is set to 2.5 V, and the voltage level of the reverse signal MBi is set to −7.5 V. On the other hand, as shown in Table 6, the voltage level of an output signal Mj of the global row decoder 111 corresponding to the normal word lines WLj by the unit of eight lines is set to −7.5 V, and the voltage level of the reverse signal MBj is set to 2.5 V. As shown in Table 7, the voltage level of an output signal Mrd of the R/D global row decoder 112 corresponding to the normal word lines WLrd by the unit of eight lines replaced using the redundancy memory cell group 110b is set to −7.5 V, and the voltage level of the reverse signal MBrd is set to 2.5 V.

On the other hand, the voltage of output signals Fi, Fj, Fi/Fj of the local row decoder 113 and R/D local row decoder 114 to which the lower addresses are supplied is set to 2.5 V. As a result, since a voltage of 2.5 V is applied to the defective word line WLi connected to the defective bit, the defective bit is not erased, a bias between the word line and the well region is alleviated, and damages by the write/erase are reduced.

On the other hand, since the voltage of −7.5 V is applied to the normal word lines WLj, WLrd connected to the normal bits, a usual erase operation is carried out in the normal bit.

At the time of the block erasing, the voltage level of reverse signals MBj, MBrd of output signals Mj, Mrd of the global row decoder 111 and R/D global row decoder 112 is set to 2.5 V, and a voltage level of −7.5 V of the erase voltage VBBB is output to the normal word lines WLj, WLrd via the NMOS transfer gates TG2 brought into an on state by the reverse signals MBj, MBrd. Therefore, the usual erase is carried out in the normal bit.

On the other hand, the voltage level of the reverse signal MBi of the output signal Mi of the global row decoder 111 is set to −7.5 V. Therefore, the NMOS transfer gate TG2 to which the reverse signal MBi is applied is brought into an off state, and the erase voltage VBBB is not applied to the defective word line WLi in which there are defective bits.

Figure 10:
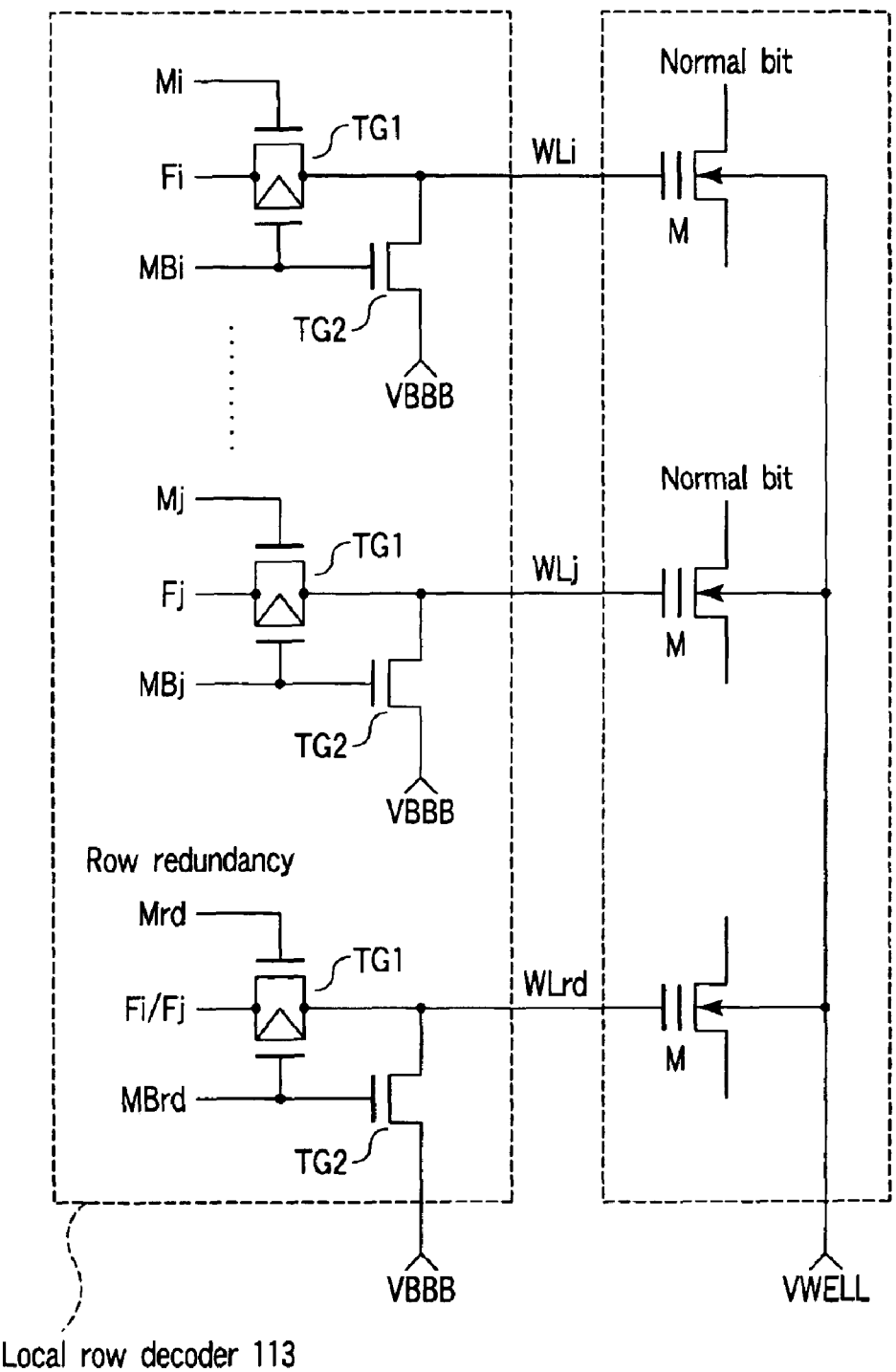
FIG. 10 is a circuit diagram showing a part extracted from the circuit in a case where the defective bit does not exist in the sub-cell array of the flash memory of FIG. 3.

In FIG. 10, in a case where the defective bit does not exist in the sub-cell arrays 110 of the NOR type flash memory shown in FIG. 3 and the replacement using the redundancy memory cell group 110b is not carried out, a circuit connection relation is shown between the output circuits of some of the local row decoders 113 and some of the memory cells M. In FIG. 10, parts corresponding to those in FIG. 9 are denoted with the same reference numerals, and the description thereof is omitted.

Next, the operation of the circuit of FIG. 10 at the time of the data erase will be described with reference to Tables 8 to 10.

TABLE 8

| Mi | MBi | Fi | VBBB | WLi | VWELL |
|---|---|---|---|---|---|
| −7.5 V | 2.5 V | 2.5 V | −7.5 V | −7.5 V | 10 V |

TABLE 9

| Mj | MBj | Fj | VBBB | WLj | VWELL |
|---|---|---|---|---|---|
| −7.5 V | 2.5 V | 2.5 V | −7.5 V | −7.5 V | 10 V |

TABLE 10

| Mrd | MBrd | Fi/Fj | VBBB | WLrd | VWELL |
|---|---|---|---|---|---|
| 2.5 V | −7.5 V | 2.5 V | −7.5 V | 2.5 V | 10 V |

The drain potential Vd of the selected memory cell M, that is, the potential of the bit line connected to the selected memory cell M is in the floating state (FL), and the source potential Vs and the well potential VWELL supplied to the well region are both set to +10 V.

At this time, as shown in Tables 8, 9, the voltage levels of output signals Mi, Mj of the global row decoder 111 corresponding to the word lines WLi by the unit of eight normal lines are set to −7.5 V, and the voltage levels of the reverse signals MBi, MBj are set to 2.5 V. On the other hand, as shown in Table 10, the voltage level of an output signal Mrd of the R/D global row decoder 112 corresponding to the word lines WLrd by the unit of eight lines of the redundancy memory cell group 110b which is not used is set to 2.5 V, and the voltage level of the reverse signal MBrd is set to −7.5 V.

On the other hand, the voltages of the output signals Fi, Fj, Fi/Fj of the local row decoder 113 and R/D local row decoder 114 to which the lower addresses are supplied are set to 2.5 V. As a result, since a voltage of −7.5 V is applied to the normal word lines WLi, WLJ connected to the normal bit, and the usual erase is performed in the normal bit.

On the other hand, the voltage of 2.5 V is applied to the word line WLrd of the redundancy memory cell group 110b which is not used, and therefore the memory cells of the redundancy memory cell group 110b are not erased, the bias voltage between the word line and the well region is alleviated, and the damages by the write/erase are reduced.

As described above, when the redundancy memory cell group 110b is not used, a positive voltage of +2.5 V is supplied to the word line WLrd of the redundancy memory cell group 110b at the time of the data erase, and this prevents the memory cells in the redundancy memory cell group from being excessively erased. If the memory cells in the redundancy memory cell group 110b are excessively erased, and the threshold voltage is lower than 0 V, and even when a voltage of 0 V is supplied to the word line WLrd of the non-selected redundancy memory cell group 110b at the time of reading, the current of the memory cell cannot be cut, and read malfunction is possibly caused.

At the time of the block erasing, the voltage levels of the reverse signals MBi, MBj of the output signals Mi, Mj of the global row decoder 111 are set to 2.5 V, and an erase voltage of −7.5 V is applied to the normal word lines WLi, WLJ via the NMOS transfer gates TG2 brought into the on state by the reverse signals MBi, MBj. Therefore, the usual erase is carried out in the normal bit.

On the other hand, the voltage level of the reverse signal MBrd of the output signal Mrd of the R/D global row decoder 112 is set to −7.5 V. The NMOS transfer gate TG2 to which the reverse signal MBrd is applied turns to the off state, and the erase voltage VBBB is not applied to the word line WLrd of the redundancy memory cell group 110b which is not used.

As described above, at the time of the erasing of the memory cell of the normal bit, the voltage level of the word line is −7.5 V (WLj=−7.5 V), the voltage level of the well region is +10 V (VWELL=+10 V), and the voltage stress added to the memory cell is 17.5 V. On the other hand, a maximum voltage which is determined by a withstand voltage (+10 V) of the row decoder and which is 2.5 V (WLi 2.5 V) in the present example is applied to the defective word line connected to the defective bit. For the defective cell, the voltage level of the word line is +2.5 V, the voltage level of the well region is +10 V (VWELL=+10 V), and the voltage stress added to the memory cell can be alleviated to +7.5 V. Therefore, the short circuit between the word line and the well region by the write/erase is not caused.

That is, by the NOR type flash memory according to the first embodiment, when the write/erase is repeated with respect to the memory cell, the bit defect causing the short circuit between the word line and well region can be relieved using the row redundancy which has heretofore been overlooked. When the positive voltage is applied to the word line including the defective bit, the market defect involved in the write/erase can be prevented. Especially, in the flash memory integrated in a same semiconductor chip as that of a microprocessor for a controller, the number of possible rewrites per memory cell may be about 100 in the existing circumstances, and this degree of the number of possible rewrites can sufficiently be satisfied.

Additionally, as described above, even when the positive voltage is applied to the word line including the defective bit, a potential difference is made between the word line and the well region. Therefore, in the repetition of the write/erase with respect to the memory cell, a certain degree of fluctuation of a threshold voltage possibly occurs. For characteristics of the memory cell, for reasons such as a cause by a statistic element from a manufacturing unevenness, a peculiar case where the threshold voltage deviates from a normal distribution could exist. Such memory cell is referred to as a hem bit. When the hem bit exists in the memory cell connected to a word line group of the redundancy memory cell group or a word line group including the defective word line, with an increase of the number of write/erase operations, the threshold voltage gradually shifts to a low side. In a worst case, even when the voltage of the word line is 0 V, the memory cell is brought in the on state, and the defective bit is generated.

To remove the defective bit, a known self convergence control circuit 130 may be disposed as shown in FIG. 3.

The self convergence control circuit 130 has a function of setting all the word lines in an erase block to 0 V after the data erase operation with respect to the memory cell in the selected cell block, and further selecting the bit line to set the voltage to about 5 V. By this function, with respect to the floating gate of the memory cell whose threshold voltage is lower than usual, electrons are injected by an avalanche hot carrier (DAHC) on a drain side, and the threshold voltage of this memory cell can be recovered (self-converged) to a certain positive value in a self-matching manner. Accordingly, the threshold voltage of all the memory cells in the selected cell block is collectively controlled in a certain range.

It is to be noted that the nonvolatile semiconductor memory device of the present invention can also be applied to the NOR type flash memory which has a row decoder other than a double row decoder shown in FIG. 3. The device can be applied to not only the NOR type flash memory but also a NAND type flash memory.

<Second Embodiment>

Figure 11:
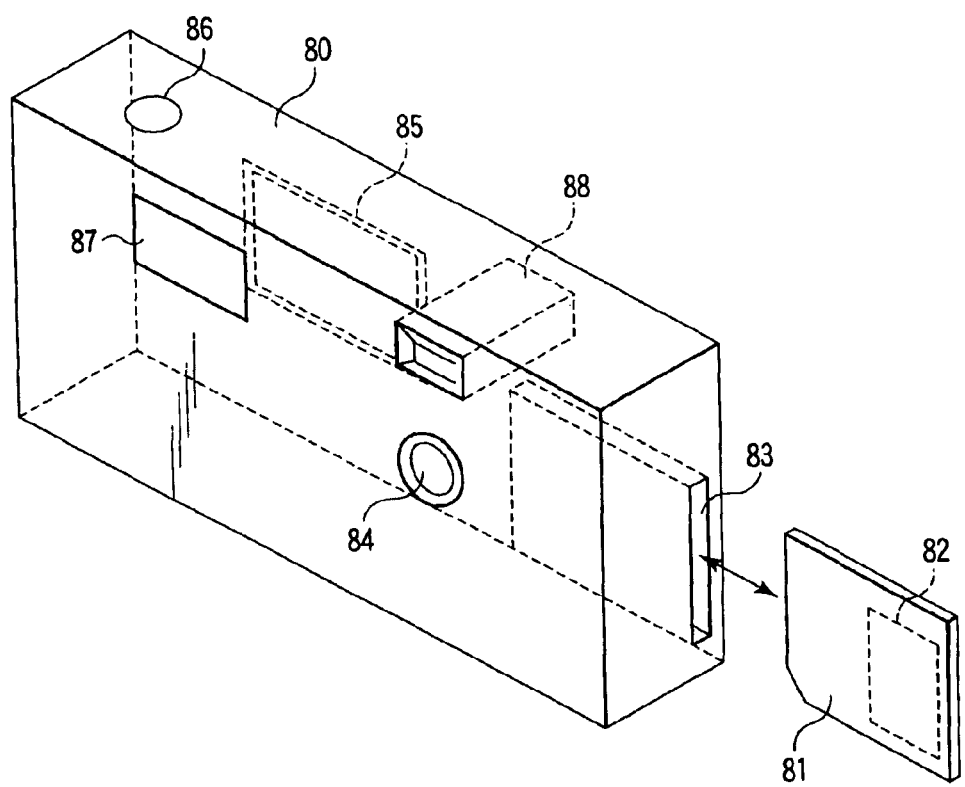
FIG. 11 is a perspective view showing a digital still camera which is one example of an electronic card using the flash memory of FIG. 3, and an electronic apparatus using the electronic card.

FIG. 11 shows one example of the constitution of an electronic card using the above-described NOR type flash memory, and an electronic apparatus using this electronic card.

Here, as one example of the electronic apparatus, a portable electronic apparatus such as a digital still camera 80 is shown. In an electronic card (e.g., a memory card) 81 for use as a recording medium of the digital still camera 80, an IC package 82 is disposed in which the above-described NAND flash memory is integrated and sealed as described above in the first embodiment.

In the digital still camera 80, a card slot 83 and a circuit substrate connected to the slot are contained. The memory card 81 is detachably attached to the card slot 83, and electrically connected to an electronic circuit on the circuit substrate in the attached state. It is to be noted that when the memory card 81 is, for example, a non-contact type of IC card, the card is contained in or brought close to the card slot 83, and is accordingly electrically connected to the electronic circuit on the circuit substrate by a radio signal.

It is to be noted that in FIG. 11, reference numeral 84 denotes a lens, 85 denotes a display section, for example, including a liquid crystal monitor, 86 denotes an operation button such as a shutter button, 87 denotes a stroboscopic lamp, and 88 denotes a finder.

Figure 12:
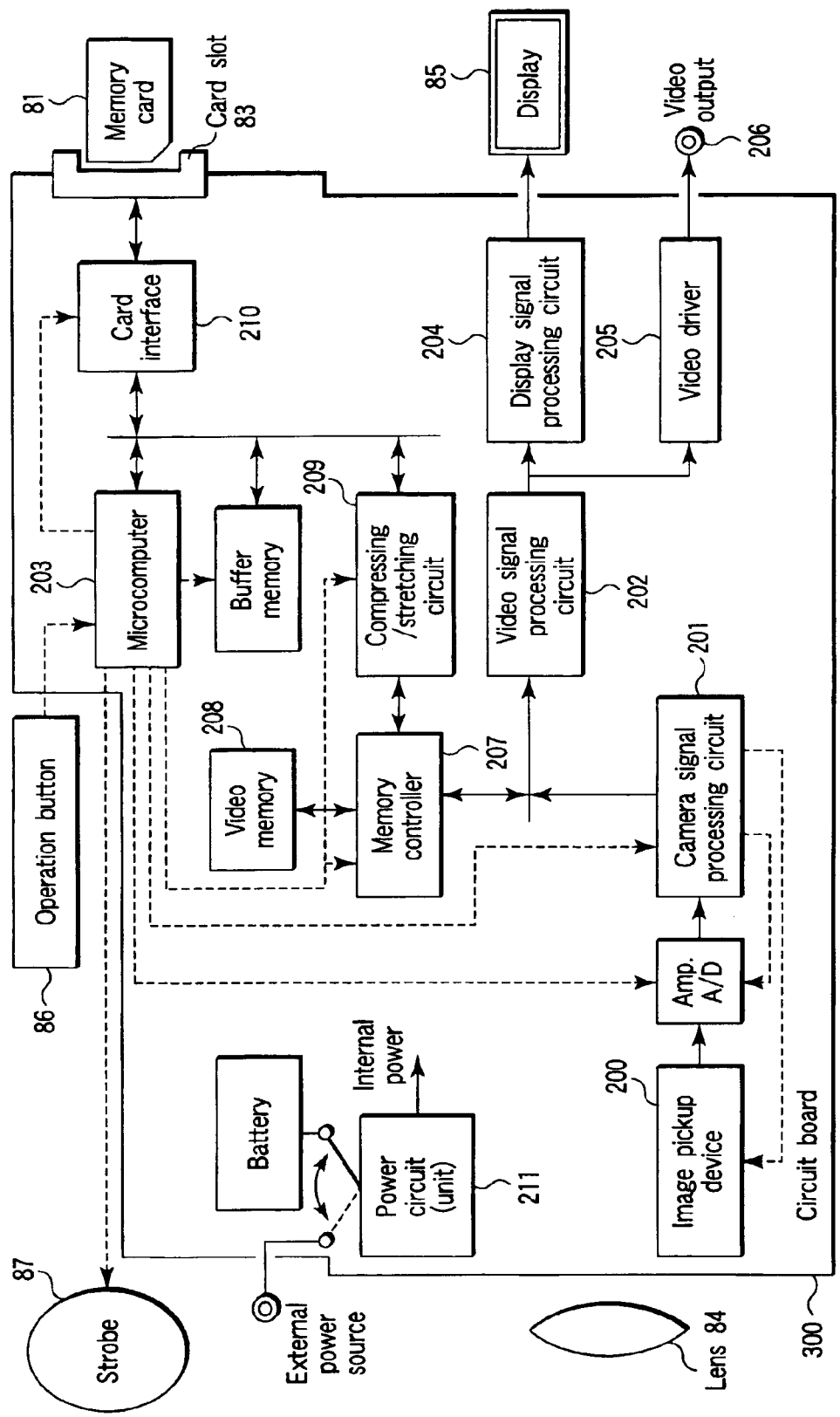
FIG. 12 is a block diagram showing a basic circuit constitution example of the digital still camera shown in FIG. 11.

FIG. 12 shows a basic constitution of the digital still camera shown in FIG. 11.

A light from a subject is converged by the lens 84 and input in an image pickup device 200. For example, the image pickup device 200 formed, for example, of a CMOS image sensor photoelectrically converts the input light to output, for example, an analog signal. This analog signal is amplified by an analog amplifier (AMP), and subsequently digital-converted by an analog to digital converter (ADC). The converted signal is input into a camera signal processing circuit 201, subjected, for example, to an automatic exposure control (AE), automatic white balance control (AWB), and color separation treatment, and thereafter converted into a luminance signal and color difference signal.

To monitor an image, the signal output from the camera signal processing circuit 201 is input into a video signal processing circuit 202, and converted to a video signal. Examples of a system of the video signal include National Television System Committee (NTSC). The image pickup device 200, AMP., ADC, and camera signal processing circuit 201 are controlled by a microcomputer 203.

The video signal is output to a display 85 applied to the digital still camera 80 via a display signal processing circuit 204. The video signal is given to a video output terminal 206 via a video driver 205.

The image photographed by the digital still camera 80 in this manner can be output as a video output to a video apparatus such as television set via the video output terminal 206. Accordingly, the photographed image can also be displayed in a section other than the display 85.

To capture the image, an operator presses the operation button 86. Accordingly, the microcomputer 203 controls a memory controller 207, and the signal output from the camera signal processing circuit 201 is written as a frame image in a video memory 208. The frame image written in this manner is compressed based on a predetermined compression format by a compressing/stretching circuit 209, and recorded in the memory card 81 attached to the card slot 83 via a card interface 210.

To reproduce a recorded image, the image recorded in the memory card 81 is read via the card interface 210, stretched by the compressing/stretching circuit 209, and subsequently written in the video memory 208. The written image is input into the video signal processing circuit 202, and reflected in the display 85 or video apparatus in the same manner as in the monitoring of the image.

It is to be noted that in the above-described constitution, on a circuit board 300, the card slot 83, image pickup device 200, AMP., ADC, camera signal processing circuit 201, video signal processing circuit 202, display signal processing circuit 204, video driver 205, microcomputer 203, memory controller 207, video memory 208, compressing/stretching circuit 209, and card interface 210 are mounted. Here, the card slot 83 does not have to be mounted on the circuit board 300, and may also be connected to the circuit board 300 via a connector cable, and the like.

Moreover, further on the circuit board 300, a power circuit 211, for example, including a DC/DC converter, and the like are mounted. The power circuit 211 receives a power supply from an external power source or battery, and generates an internal power voltage for use in the digital still camera 80. The internal power voltage is supplied not only to the above-described circuits but also to the stroboscopic lamp 87 and the display 85.

Figure 13A:
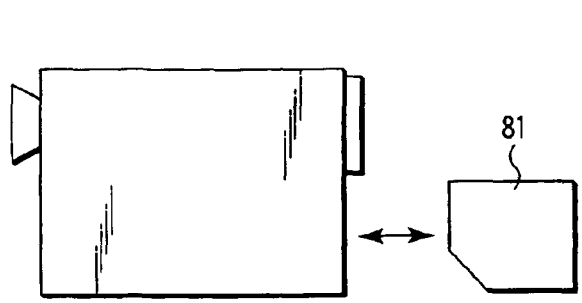
FIGS. 13A to 13J are front view schematically showing a constitution example of various electronic apparatuses in which the electronic card shown in FIG. 11 is used.
Figure 13F:
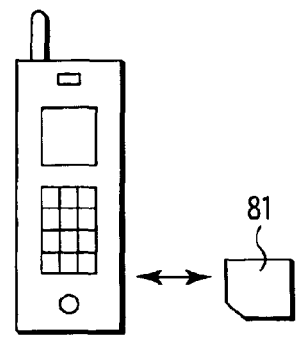
Figure 13B:
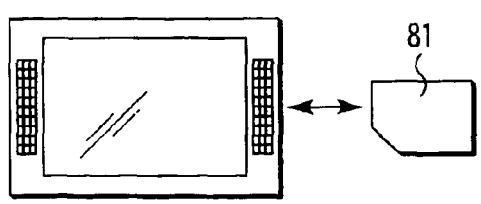
Figure 13G:
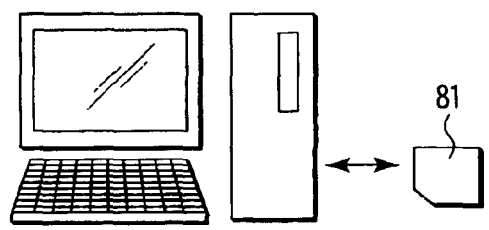
Figure 13C:
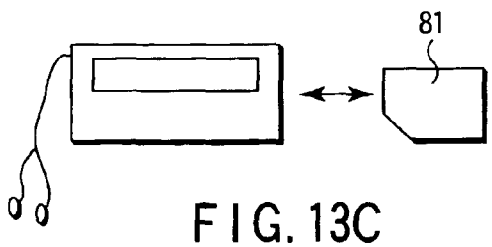
Figure 13H:
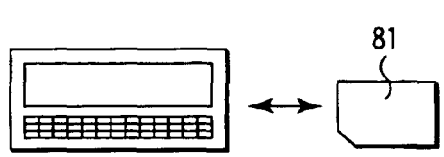
Figure 13D:
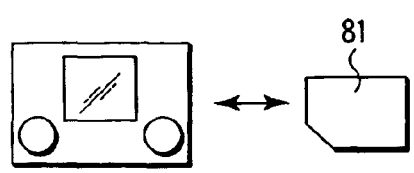
Figure 13I:
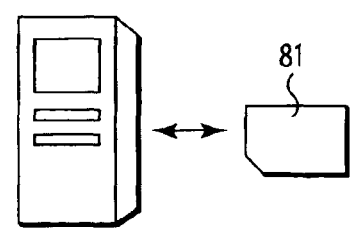
Figure 13E:
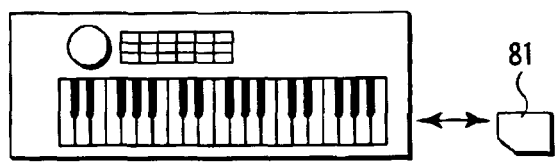
Figure 13J:
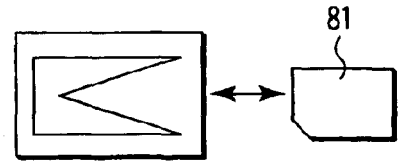

The electronic card according to the present embodiment can be applied not only to the portable electronic apparatuses such as the above-described digital still camera but also to various apparatuses schematically shown in, for example, FIGS. 13A to 13J. That is, FIG. 13A shows a video camera, FIG. 13B shows a television set, FIG. 13C shows an audio apparatus, FIG. 13D shows a game apparatus, FIG. 13E shows an electronic musical instrument, FIG. 13F shows a cellular phone, FIG. 13G shows a personal computer, FIG. 13H shows a personal digital assistance (PDA), FIG. 13I shows a voice recorder, and FIG. 13J shows a PC card (e.g., PC card memory), for example, including a mode of PCMCIA standard.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor memory device having a write operation mode, a read operation mode, and an erase operation mode, the nonvolatile semiconductor memory device comprising:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other;

a plurality of normal word lines which are disposed in the respective cell blocks and which are connected to the memory cells in the normal memory cell group and which select the memory cells in the normal memory cell groups;

a plurality of redundancy word lines which are disposed in the respective cell blocks and which are connected to the memory cells in the redundancy memory cell group and which are replaced with the normal word lines and used, and which select the memory cells in the redundancy memory cell group;

a plurality of bit lines which are disposed in the respective cell blocks and which are connected to the memory cells in the normal memory cell group and the memory cells in the redundancy memory cell group;

a well control circuit which is connected to the plurality of semiconductor regions and which applies a first voltage having a positive polarity to the semiconductor region corresponding to at least one cell block among the plurality of cell blocks, at the time of the erase operation mode; and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced.

2. A nonvolatile semiconductor memory device according to claim 1, wherein the third voltage is lower than the first voltage and which has a positive polarity.

3. A nonvolatile semiconductor memory device according to claim 1, further comprising:
a defective address memory circuit in which a defective row address corresponding to a defective memory cell present in the plurality of cell blocks is stored;
a comparison circuit which is connected to the defective address memory circuit and which receives an external input address and the stored address of the defective address memory circuit and compares the addresses with each other to output a comparison result indicating agreement/disagreement;
an address multiplexer which is connected to the comparison circuit and which selects the stored address of the defective address memory circuit as an address for replacing the normal word line corresponding to the defective memory cell with the redundancy word line, when the comparison result indicates agreement, and which selects the external input address, when the comparison result indicates the disagreement and which outputs internal address signals; and
a column control circuit which is connected to the plurality of cell blocks and which controls a selection operation of the plurality of bit lines in each cell block and which sets the selected bit line to a predetermined voltage state in accordance with the operation mode.

4. A nonvolatile semiconductor memory device according to claim 3, wherein the row decoder includes:
a first row decoder circuit which is disposed in common with respect to the plurality of cell blocks and which outputs a first selection signal based on an upper row address signal included in the internal address signal;
a second decoder circuit which is disposed in common with respect to the plurality of cell blocks and which outputs a second selection signal based on a lower row address signal included in the internal address signal; and
a third row decoder circuit which is disposed for each of the plurality of cell blocks and which is connected to the first and second row decoder circuits and which selects the cell block based on the first and second selection signals and which further selects the plurality of normal word lines and redundancy word lines in the selected cell block and which supplies the second voltage to the normal word line corresponding to the normal memory cell in the selected cell block or the replaced redundancy word line and supplies the third voltage to the normal word line corresponding to the defective memory cell and the redundancy word line which has not been replaced at the time of the erase operation mode of the selected cell block.

5. A nonvolatile semiconductor memory device according to claim 4, wherein the third row decoder circuit includes:
a plurality of first transfer gates each of which includes one end and the other end and one end each of which is connected to the plurality of normal word lines and redundancy word lines and in which one of the second and third voltage is supplied to the other end and which are selectively in an on state at the time of the write operation mode, the read operation mode, and the erase operation mode; and
a plurality of second transfer gates each of which includes one end and the other end and one end each of which is connected to a node of an erase bias voltage having the second voltage and the other end of which is connected to the plurality of normal word lines and redundancy word lines,
wherein the second voltage is supplied to the other end of the first transfer gate whose one end is connected to the normal word line corresponding to the normal memory cell and the replaced redundancy word line, and the third voltage is supplied to the other end of the first transfer gate whose one end is connected to the normal word line corresponding to the defective memory cell or the redundancy word line which has not been replaced, at the time of the erase operation mode, and
the second transfer gate whose one end is connected to the normal word line corresponding to the normal memory cell and the replaced redundancy word line is controlled in on state to pass the second voltage, and the second transfer gate whose one end is connected to the normal word line corresponding to the defective memory cell and the redundancy word line which has not been replaced is controlled in off state, at the time of the block erase operation mode.

6. A nonvolatile semiconductor memory device according to claim 1, wherein each of the plurality of normal word lines and the plurality of redundancy word lines in the plurality of cell blocks includes a double word line structure.

7. A nonvolatile semiconductor memory device according to claim 1, further comprising:
a self convergence control circuit which is connected to the plurality of cell blocks and which supplies a fourth voltage to all the word lines in the selected cell block and selects the plurality of bit lines in the cell block to supply a fifth voltage after the erase operation in the selected cell block to control threshold voltages of all the memory cells in the selected cell block in a certain range.

8. A nonvolatile semiconductor memory device according to claim 7, wherein the fourth voltage is 0 V, and the fifth voltage is a voltage having the positive polarity between the second voltage and the first voltage.

9. A nonvolatile semiconductor memory device according to claim 1, wherein the plurality of memory cells arranged in the same column of the memory cell array is NOR connected.

10. A semiconductor integrated circuit device comprising:
a nonvolatile semiconductor memory circuit having a write operation mode, a read operation mode, and an erase operation mode, the nonvolatile semiconductor memory circuit is formed in a semiconductor chip, the nonvolatile semiconductor memory circuit including:
a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other,
a plurality of normal word lines which are disposed in the respective cell blocks and which are connected to the memory cells in the normal memory cell group and which select the memory cells in the normal memory cell groups,
a plurality of redundancy word lines which are disposed in the respective cell blocks and which are connected to the memory cells in the redundancy memory cell group and which are replaced with the normal word lines and used and which select the memory cells in the redundancy memory cell group,
a plurality of bit lines which are disposed in the respective cell blocks and which are connected to the memory cells in the normal memory cell group and the memory cells in the redundancy memory cell group,
a well control circuit which is connected to the plurality of semiconductor regions and which applies a first voltage having a positive polarity to the semiconductor region corresponding to at least one selected cell block among the plurality of cell blocks at the time of the erase operation mode, and
a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced; and
a controller which is formed in the chip to control the nonvolatile semiconductor memory circuit.

11. An electronic card comprising:
a semiconductor chip in which a nonvolatile semiconductor memory circuit having a write operation mode, a read operation mode, and an erase operation mode is formed, the nonvolatile semiconductor memory circuit including:
a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other,
a plurality of normal word lines which are disposed in the respective cell blocks and which are connected to the memory cells in the normal memory cell group and which select the memory cells in the normal memory cell groups,
a plurality of redundancy word lines which are disposed in the respective cell blocks and which are connected to the memory cells in the redundancy memory cell group and which are replaced with the normal word lines and used, and which select the memory cells in the redundancy memory cell group,
a plurality of bit lines which are disposed in the respective cell blocks and which are connected to the memory cells in the normal memory cell group and the memory cells in the redundancy memory cell group,
a well control circuit which is connected to the plurality of semiconductor regions and which applies a first voltage having a positive polarity to the semiconductor region corresponding to at least one selected cell block among the plurality of cell blocks at the time of the erase operation mode, and
a row decoder which is connected to the plurality of cell blocks and which selects the plurality of cell blocks, the plurality of normal word lines, and the plurality of redundancy word lines, and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell or the redundancy word line which has not been replaced; and
a card in which the semiconductor chip is incorporated.

12. An electronic apparatus comprising:
an electronic card including a semiconductor chip in which a nonvolatile semiconductor memory circuit is formed and a package in which the semiconductor chip is sealed, the nonvolatile semiconductor memory circuit having a write operation mode, a read operation mode, and an erase operation mode, the nonvolatile semiconductor memory circuit including:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other, a plurality of normal word lines which are disposed in the respective cell blocks and which are connected to the memory cells in the normal memory cell group and which select the memory cells in the normal memory cell groups, a plurality of redundancy word lines which are disposed in the respective cell blocks and which are connected to the memory cells in the redundancy memory cell group and which are replaced with the normal word lines and used, and which select the memory cells in the redundancy memory cell group, a plurality of bit lines which are disposed in the respective cell blocks and which are connected to the memory cells in the normal memory cell group and the memory cells in the redundancy memory cell group, a well control circuit which is connected to the plurality of semiconductor regions and which applies a first voltage having a positive polarity to the semiconductor region corresponding to at least one cell block among the plurality of cell blocks at the time of the erase operation mode, and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced;

a card slot electrically connected to the electronic card; and a card interface connected to the card slot.

13. A digital still camera comprising:

an electronic card including a semiconductor chip in which a nonvolatile semiconductor memory circuit is formed and a package in which the semiconductor chip is sealed, the nonvolatile semiconductor memory circuit having a write operation mode, a read operation mode, and an erase operation mode, the nonvolatile semiconductor memory circuit including:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other, a plurality of normal word lines which are disposed in the respective cell blocks and which are connected to the memory cells in the normal memory cell group and which select the memory cells in the normal memory cell groups, a plurality of redundancy word lines which are disposed in the respective cell blocks and which are connected to the memory cells in the redundancy memory cell group and which are replaced with the normal word lines and used, and which select the memory cells in the redundancy memory cell group, a plurality of bit lines which are disposed in the respective cell blocks and which are connected to the memory cells in the normal memory cell group and the memory cells in the redundancy memory cell group, a well control circuit which is connected to the plurality of semiconductor regions and which applies a first voltage having a positive polarity to the semiconductor region corresponding to at least one cell block among the plurality of cell blocks at the time of the erase operation mode, and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced;

a card slot electrically connected to the electronic card; and a card interface connected to the card slot.

14. A personal digital assistant comprising:

an electronic card including a semiconductor chip in which a nonvolatile semiconductor memory circuit is formed and a package in which the semiconductor chip is sealed, the nonvolatile semiconductor memory circuit having a write operation mode, a read operation mode, and an erase operation mode, the nonvolatile semiconductor memory circuit including:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other, a plurality of normal word lines which are disposed in the respective cell blocks and which are connected to the memory cells in the normal memory cell group and which select the memory cells in the normal memory cell groups, a plurality of redundancy word lines which are disposed in the respective cell blocks and which are connected to the memory cells in the redundancy memory cell group and which are replaced with the normal word lines and used, and which select the memory cells in the redundancy memory cell group, a plurality of bit lines which are disposed in the respective cell blocks and which are connected to the memory cells in the normal memory cell group and the memory cells in the redundancy memory cell group, a well control circuit which is connected to the plurality of semiconductor regions and which applies a first voltage having a positive polarity to the semiconductor region corresponding to at least one cell block among the plurality of cell blocks at the time of the erase operation mode, and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced;

a card slot electrically connected to the electronic card; and a card interface connected to the card slot.

15. A voice recorder comprising:

an electronic card including a semiconductor chip in which a nonvolatile semiconductor memory circuit is formed and a package in which the semiconductor chip is sealed, the nonvolatile semiconductor memory circuit having a write operation mode, a read operation mode, and an erase operation mode, the nonvolatile semiconductor memory circuit including:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other, a plurality of normal word lines which are disposed in the respective cell blocks and which are connected to the memory cells in the normal memory cell group and which select the memory cells in the normal memory cell groups, a plurality of redundancy word lines which are disposed in the respective cell blocks and which are connected to the memory cells in the redundancy memory cell group and which are replaced with the normal word lines and used, and which select the memory cells in the redundancy memory cell group, a plurality of bit lines which are disposed in the respective cell blocks and which are connected to the memory cells in the normal memory cell group and the memory cells in the redundancy memory cell group, a well control circuit which is connected to the plurality of semiconductor regions and which applies a first voltage having a positive polarity to the semiconductor region corresponding to at least one cell block among the plurality of cell blocks at the time of the erase operation mode, and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced;

a card slot electrically connected to the electronic card; and a card interface connected to the card slot.

16. A PC card comprising:

an electronic card including a semiconductor chip in which a nonvolatile semiconductor memory circuit is formed and a package in which the semiconductor chip is sealed, the nonvolatile semiconductor memory circuit having a write operation mode, a read operation mode, and an erase operation mode, the nonvolatile semiconductor memory circuit including:

a memory cell array in which a plurality of nonvolatile semiconductor memory cells in which data is electrically erased/written are arranged in a matrix, some of the plurality of memory cells form a normal memory cell group including a normal memory space, remaining memory cells among the plurality of memory cells form a redundancy memory cell group including a redundancy memory space, the plurality of memory cells are divided into a plurality of cell blocks for each unit by which stored data is electrically collectively erased, and the plurality of memory cells in each cell block are formed in a plurality of semiconductor regions electrically isolated from each other, a plurality of normal word lines which are disposed in the respective cell blocks and which are connected to the memory cells in the normal memory cell group and which select the memory cells in the normal memory cell groups, a plurality of redundancy word lines which are disposed in the respective cell blocks and which are connected to the memory cells in the redundancy memory cell group and which are replaced with the normal word lines and used, and which select the memory cells in the redundancy memory cell group, a plurality of bit lines which are disposed in the respective cell blocks and which are connected to the memory cells in the normal memory cell group and the memory cells in the redundancy memory cell group, a well control circuit which is connected to the plurality of semiconductor regions and which applies a first voltage having a positive polarity to the semiconductor region corresponding to at least one cell block among the plurality of cell blocks at the time of the erase operation mode, and a row decoder which is connected to the plurality of cell blocks and which selects the plurality of cell blocks, the plurality of normal word lines, and the plurality of redundancy word lines and which supplies a second voltage having a negative polarity to the selected normal word line corresponding to a normal memory cell in the selected cell block at the time of the erase operation mode to control the erase operation of the memory cell and which supplies a third voltage having a potential difference from the first voltage is smaller than that between the first voltage and second voltage to the selected normal word line corresponding to a defective memory cell and the redundancy word line which has not been replaced;

a card slot electrically connected to the electronic card; and a card interface connected to the card slot.

* * * * *